US010254650B2

(12) United States Patent
Huang et al.

(10) Patent No.: US 10,254,650 B2
(45) Date of Patent: Apr. 9, 2019

(54) LOW TEMPERATURE SC1 STRIPPABLE OXYSILANE-CONTAINING COATINGS

(71) Applicant: Honeywell International Inc., Morris Plains, NJ (US)

(72) Inventors: Hong Min Huang, Shanghai (CN); Chao Liu, San Jose, CA (US); Helen Xiao Xu, Sunnyvale, CA (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/609,573

(22) Filed: May 31, 2017

(65) Prior Publication Data

US 2018/0004089 A1 Jan. 4, 2018

Related U.S. Application Data

(60) Provisional application No. 62/356,267, filed on Jun. 29, 2016.

(51) Int. Cl.
| | |
|---|---|
| C09D 4/06 | (2006.01) |
| G03F 7/11 | (2006.01) |
| C09D 4/00 | (2006.01) |
| C09D 5/20 | (2006.01) |
| G03F 7/09 | (2006.01) |
| G03F 7/16 | (2006.01) |
| G03F 7/42 | (2006.01) |
| H01L 21/027 | (2006.01) |
| H01L 21/3065 | (2006.01) |
| H01L 21/308 | (2006.01) |
| H01L 21/3105 | (2006.01) |
| H01L 21/311 | (2006.01) |
| G03F 7/075 | (2006.01) |

(52) U.S. Cl.
CPC .............. *G03F 7/11* (2013.01); *C09D 4/00* (2013.01); *C09D 4/06* (2013.01); *C09D 5/20* (2013.01); *G03F 7/0752* (2013.01); *G03F 7/094* (2013.01); *G03F 7/162* (2013.01); *G03F 7/42* (2013.01); *H01L 21/0274* (2013.01); *H01L 21/3065* (2013.01); *H01L 21/3081* (2013.01); *H01L 21/3086* (2013.01); *H01L 21/31051* (2013.01); *H01L 21/31138* (2013.01); *H01L 21/31144* (2013.01)

(58) Field of Classification Search
CPC ........ H01L 51/00; H01L 51/0034; G03F 7/11; C09D 4/06
See application file for complete search history.

(56) References Cited

U.S. PATENT DOCUMENTS

| | | | |
|---|---|---|---|
| 4,738,916 A | 4/1988 | Namatsu et al. | |
| 4,891,303 A | 1/1990 | Garza et al. | |
| 5,104,479 A | 4/1992 | Kotachi et al. | |
| 7,049,048 B2 | 5/2006 | Hunter et al. | |
| 7,507,783 B2 | 3/2009 | Meador et al. | |
| 8,642,246 B2 | 2/2014 | Kennedy et al. | |
| 9,177,819 B2 | 11/2015 | Umekawa et al. | |
| 2013/0171569 A1 | 7/2013 | Tachibana et al. | |
| 2013/0209754 A1 | 8/2013 | Zhang et al. | |
| 2016/0319156 A1* | 11/2016 | Rathore | C09D 183/04 |

FOREIGN PATENT DOCUMENTS

| | | |
|---|---|---|
| KR | 20160020230 A | 2/2016 |
| WO | 2016089635 A1 | 6/2016 |

OTHER PUBLICATIONS

Jiang, Hongmei, et al. "Alkoxysilane Functionalized Polyurethane/Polysiloxane Copolymers: Synthesis and the Effect of End-Capping Agent." Polymer Bulletin 59:53-63, 2007.
Kessel, Carl R., et al. "Novel Silicon-Containing Resists for EUV and 193 nm Lithography." Part of the SPIE Conference on Advances in Resist Technology and Processing XVI, Santa Clara, California, Mar. 1999, SPIE vol. 3678, pp. 214-220.
Nalamasu, O., et al. "Revolutionary and evolutionary resist design concepts for 193 nm lithography." Microelectronic Engineering 35:133-136, 1997.
International Search Report and Written Opinion issued in PCT/US2017/038116, dated Sep. 19, 2017, 12 pages.

* cited by examiner

*Primary Examiner* — Quoc Hoang
(74) *Attorney, Agent, or Firm* — Faegre Baker Daniels LLP

(57) ABSTRACT

A composition for forming a coating is provided including at least one oxysilane-containing polymer or oligomer having an oxysilane group and at least one other organic crosslinkable group; an endcapping agent; and a solvent. A coated substrate, wherein the substrate is a silicon wafer or coated silicon wafer, includes an organic planarization layer in contact with the substrate, a photoresist layer, and a middle layer positioned between the organic planarization layer and the photoresist layer. The middle layer is formed from a composition including at least one oxysilane-containing polymer or oligomer having an oxysilane group and at least one other organic crosslinkable group, an endcapping agent; and a solvent.

20 Claims, 1 Drawing Sheet

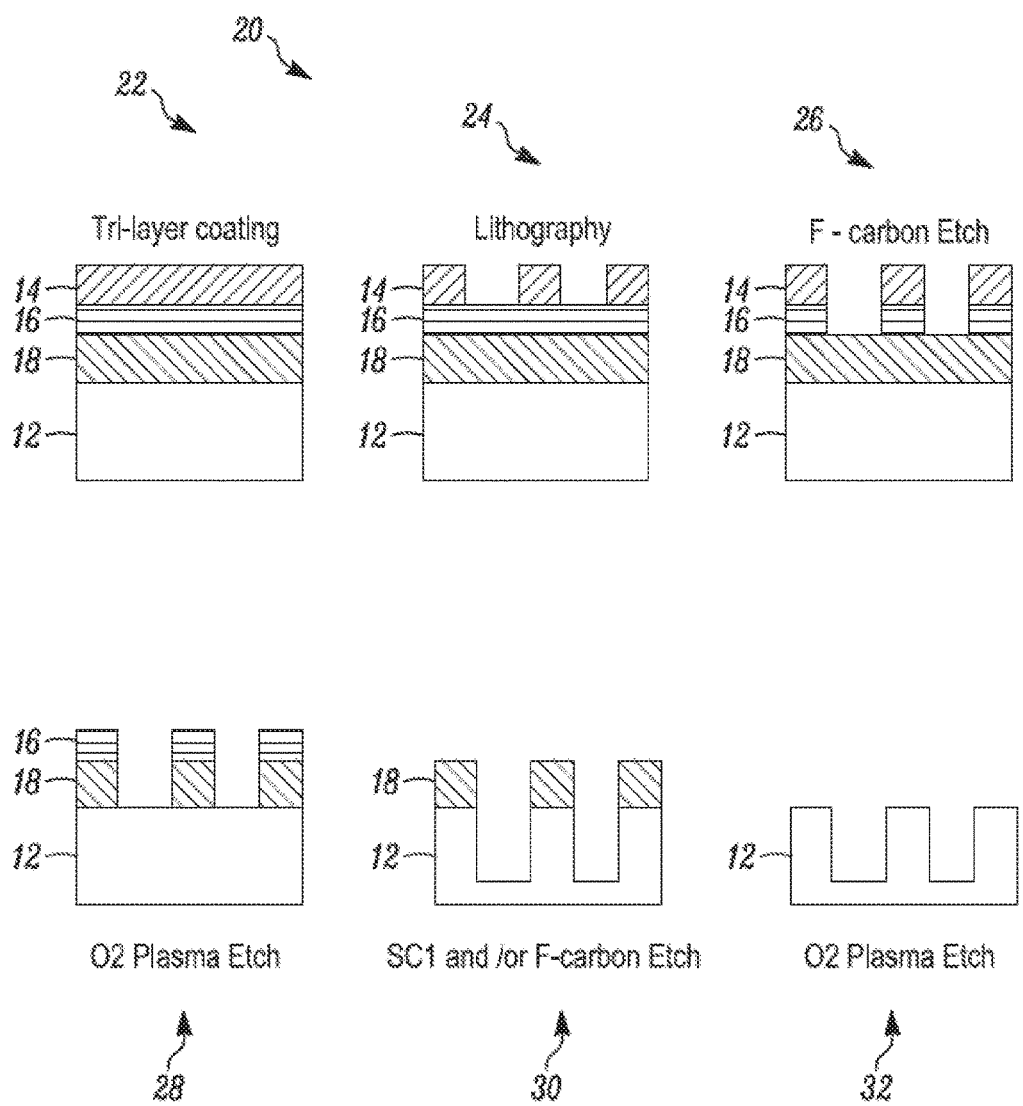
(Prior Art)

LOW TEMPERATURE SC1 STRIPPABLE OXYSILANE-CONTAINING COATINGS

CROSS-REFERENCE TO RELATED APPLICATIONS

The present application claims the benefit under Title 35, U.S.C. § 119(e) of U.S. Provisional Patent Application Ser. No. 62/356,267, entitled LOW TEMPERATURE SC1 STRIPPABLE OXYSILANE-CONTAINING COATINGS, filed on Jun. 29, 2016, the entire disclosure of which is expressly incorporated herein.

TECHNICAL FIELD

The present disclosure relates generally to oxysilane compositions and coatings made from those compositions, and more particularly to oxysilane formulations and coatings for use in electronic devices and applications.

BACKGROUND

Three-layer patterning processes are used in photolithography for semiconductors to pattern a semiconductor substrate. An exemplary three-layer patterning process 20 is illustrated in FIG. 1.

As shown in FIG. 1, a substrate 12, such as a silicon wafer, is provided with three layers: a photoresist layer 14, a middle layer 16, and an organic planarization layer 18. As shown in step 22, the layers may be sequentially applied by spin coating processes. In step 24, a lithography step patterns the photoresist layer 14. In step 26, a first fluorocarbon plasma etching step etches the portions of the middle layer 14 exposed through the pattern in the photoresist layer 14, transferring the pattern from the photoresist layer 14 to the middle layer 16. In step 28, a first oxygen plasma etching step removes the photoresist layer 14 and etches the portions of the organic planarization layer 18 exposed through the transferred pattern in the middle layer 16, transferring the pattern from the middle layer 16 to the organic planarization layer 18. In step 30, a wet etching step and/or a second fluorocarbon plasma etching step removes the middle layer 16 and etches the portions of the substrate 12 exposed through the transferred pattern in the organic planarization layer 18, transferring the pattern from the organic planarization layer 18 to the substrate 12. In step 32, a second oxygen plasma etching step removes the organic planarization layer 18, leaving behind only the patterned substrate 12.

In a typical process, the middle layer 16 may be removed by an acid-based wet etching solution. However, such a solution may cause damage to the exposed substrate 12 underneath. In particular, when the nodes of the transferred pattern are less than about 10 nm in width, such as nodes of 7 nm or 5 nm, the metal layers of the patterned substrate 12 become thinner, and are potentially more easily damaged by an acid-based etching solution.

To prevent damage to the substrate 12, an alkaline stripping solution may be used. An exemplary alkaline stripping solution is Standard Clean 1 (SC1), which is a high pH solution including deionized water, ammonium hydroxide, and hydrogen peroxide designed to remove organic films by oxidative breakdown and dissolution without damaging an underlying silicon wafer substrate. A typical SC1 solution is (by volume) 5 parts deionized water, 1 part 29% ammonium hydroxide, and 1 part 30% hydrogen peroxide. SC1 can be diluted to different concentrations, in some exemplary embodiments, dilute SC1 contains as little as 10 parts, 20 parts, 30 parts, 40 parts, as great as 50 parts, 60 parts, 80 parts, 100 parts deionized water, 1 part 29% ammonium hydroxide, and 1 part 30% hydrogen peroxide. Ratios between hydrogen peroxide and ammonium hydroxide can also vary, in some other exemplary embodiments, dilute SC1 contains 60 parts deionized water, 1 part 29% ammonium hydroxide, and as little as 2 parts, 5 parts, 10 parts, as great as 18 parts, 20 parts, 30 parts, 50 parts 30% hydrogen peroxide. The typical processing temperature for SC1 stripping is from 70° C. to 80° C., however a lower temperature SC1 process, such as strippability at 65° C. or less, such as 25° C. to 65° C., would be desirable for less unwanted etching, easier process control and lower cost.

The use of typical oxysilane materials for the middle layer 16 is limited by their poor stippability in SC1 solutions. Typical oxysilane materials containing repeating —(Si—O)$_n$— units enable good coating performance and optical properties and, due to the inherent stability and flexibility of the siloxane (Si—O—Si) bond, those coatings can provide multiple benefits including extraordinary thermal stability, chemical resistance, good adhesion, scratch and abrasion resistance, superior gap fill and planarization and excellent dielectric properties.

However, typical polymers or oligomers containing oxysilane groups tend to continue condensing or crosslinking following baking or curing processing steps. The continued reaction results in a relatively high number of condensed —(Si—O)$_n$— units, which are relatively resistant to stripping by SC1 solutions and especially resistant to low temperature SC1 solutions.

Improvements in the foregoing are desired.

SUMMARY

The present disclosure provides oxysilane formulations that can form coatings having good strippability in alkaline stripping solutions. The composition includes a polymer having an oxysilane and at least one other organic crosslinkable group, an endcapping agent, and a solvent.

In one exemplary embodiment, a composition is provided. That includes at least one oxysilane-containing polymer or oligomer having an oxysilane group and at least one other organic crosslinkable group, an endcapping agent, and a solvent.

In a more particular embodiment, the oxysilane-containing polymer or oligomer has the formula:

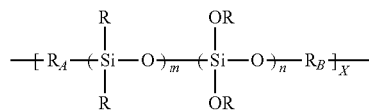

where each R is independently selected from hydrogen, substituted or unsubstituted alkyl groups, substituted or unsubstituted aryl groups, substituted or unsubstituted alkenyl groups, substituted or unsubstituted cycloalkyl groups, substituted or unsubstituted acrylic groups, and combinations thereof;

$R_A$ and $R_B$ are each a polymer moieties containing one or more crosslinkable groups independently selected from the group consisting of: alkenes, alkynes, acrylates, carboxylic acids, alcohols, isocyanates, aldehydes, amines, urethane acrylates, polyester acrylates, and epoxies;

m is an integer from 0 to 10;
n is an integer from 1 to 10; and
X is an integer from 1 to 10.

In a more particular embodiment of any of the above embodiments, the oxysilane-containing polymer or oligomer is an oxysilane containing acrylic urethane.

In a more particular embodiment of any of the above embodiments, the oxysilane-containing polymer or oligomer has the formula:

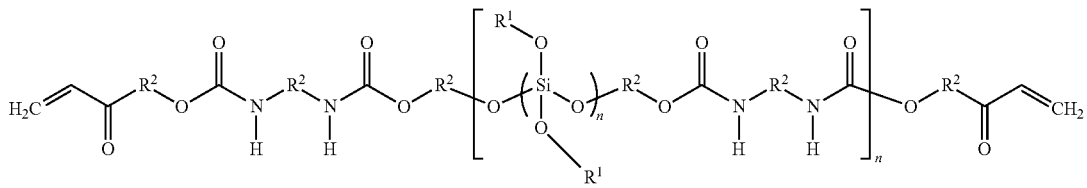

where

R¹ is selected from hydrogen, substituted or unsubstituted alkyl groups, substituted or unsubstituted aryl groups, substituted or unsubstituted alkenyl groups, substituted or unsubstituted cycloalkyl groups, substituted or unsubstituted acrylic groups, and combinations thereof;

R² are each independently selected from substituted or unsubstituted alkylene groups, substituted and unsubstituted arylene groups, and combinations thereof; and n is an integer from 1 to 10.

In a more particular embodiment of any of the above embodiments, the oxysilane-containing polymer or oligomer has a weight average molecular weight of 500 Dalton to 10,000 Dalton.

In a more particular embodiment of any of the above embodiments, the oxysilane-containing polymer or oligomer comprises from 1 wt. % to 30 wt. % silicon.

In a more particular embodiment of any of the above embodiments, the oxysilane-containing polymer or oligomer comprises from 0.5 wt. % to 30 wt. % of the total weight of the composition.

In a more particular embodiment of any of the above embodiments, the solvent is selected from the group consisting of acetone, diethyl ketone, methyl ethyl ketone, ethyl lactate, propylene glycol propylether (PGPE), propylene glycol monomethyl ether acetate (PGMEA) or a combination thereof. In a still more particular embodiment, the solvent includes PGMEA.

In a more particular embodiment of any of the above embodiments, the endcapping agent is a monofunctional silane including a single reactive functionality.

In a more particular embodiment of any of the above embodiments, the endcapping agent is selected from the group consisting of: trimethylethoxy silane, triethylmethoxy silane, trimethylacetoxy silane, trimethylsilanol, triphenylsilanol, triphenylmethoxysilane, triphenylethoxysilane.

In a more particular embodiment of any of the above embodiments, the endcapping agent is trimethylethoxy silane.

In a more particular embodiment of any of the above embodiments, the endcapping agent includes acetoxy trimethyl silane.

In a more particular embodiment of any of the above embodiments, a molar ratio of endcapping agent to moles of crosslinkable groups on the oxysilane-containing polymer or oligomer is from 1:100 to 1:1.

In a more particular embodiment of any of the above embodiments, the endcapping agent comprises form 0.1 wt. % to 20 wt. % of the total weight of the composition.

In a more particular embodiment of any of the above embodiments, the composition further includes at least one surfactant. In a still more particular embodiment, the surfactant comprises from 0.01 wt. % to 15 wt. % of the total weight of the composition.

In a more particular embodiment of any of the above embodiments, the composition further includes at least one additive selected from the group consisting of a crosslinker, an initiator, and an antioxidant.

In one exemplary embodiment, a coating formed from any of the above embodiments is provided. In one more particular embodiment, the coating has an etch rate of at least 10 Å/min in SC1 at a temperature of 60° C. In a more particular embodiment, the SC1 solution comprises is formed from 29% NH₄OH, 30% H₂O₂, and H₂O in a 1/8/60 ratio by volume. In another more particular embodiment, the coating has an etch rate in the SC1 solution of at least 50 Å/min. In a more particular embodiment, the coating has a minimum temperature for SC1 stripping from 25° C. to 65° C. In a more particular embodiment of any of the above embodiments, the coating has an etch rate in PGMEA at room temperature and 2.38% TMAH solution at room temperature of 50 Å/min or less.

In one exemplary embodiment, a coated substrate is provided. The coated substrate includes the substrate, wherein the substrate is a silicon wafer or coated silicon wafer; an organic planarization layer in contact with the substrate; a photoresist layer; and a middle layer positioned between the organic planarization layer and the photoresist layer. The middle layer is formed from a composition comprising: at least one oxysilane-containing polymer or oligomer having an oxysilane group and at least one other organic crosslinkable group; an endcapping agent; and a solvent. In a more particular embodiment, the middle layer has an etch rate in SC1 solution of 150 Å/min or greater and an etch rate in PGMEA at room temperature and 2.38% TMAH solution at room temperature of 50 Å/min or less. In a more particular embodiment, the SC1 solution comprises is formed from 29% NH₄OH, 30% H₂O₂, and H₂O in a 1/8/60 ratio by volume.

In one exemplary embodiment, a method of patterning a substrate is provided. The method includes sequentially applying an organic planarization layer, a middle layer, and a photoresist layer to a surface of the substrate, the middle layer formed from a composition comprising at least one oxysilane-containing polymer or oligomer having an oxysilane group and at least one other organic crosslinkable group, an endcapping agent, and a solvent; patterning the photoresist layer using photolithography and removing a portion of the photoresist layer to transfer the pattern to the photoresist layer; removing a portion of the middle layer to transfer the pattern to the middle layer; removing the patterned photoresist layer and removing a portion of the organic planarization layer to transfer the pattern to the organic planarization layer; removing the patterned middle layer and removing a portion of the substrate to transfer the pattern to the substrate; and removing the patterned organic planarization layer.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

FIG. 1 illustrates an exemplary three-layer patterning process.

Corresponding reference characters indicate corresponding parts throughout the several views. The exemplifications set out herein are provided to illustrate certain exemplary embodiments and such exemplifications are not to be construed as limiting the scope in any manner.

In one exemplary embodiment, the oxysilane-containing compound has the following formula:

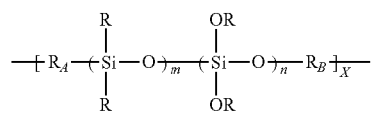

where:

R is selected from hydrogen, substituted or unsubstituted alkyl groups, substituted or unsubstituted aryl groups, substituted or unsubstituted alkenyl groups, substituted or unsubstituted cycloalkyl groups, substituted or unsubstituted acrylic groups, and a combination thereof;

Ra and Rb are independently selected from polymer moieties containing one or more crosslinkable groups selected from alkenes, alkynes, acrylates, carboxylic acids, alcohols, isocyanates, aldehydes, amines, urethane acrylates, polyester acrylates, epoxies;

m is an integer from 0 to 10; and n and X are independently each an integer from 1 to 10.

In one exemplary embodiment, the oxysilane-containing compound has the following formula:

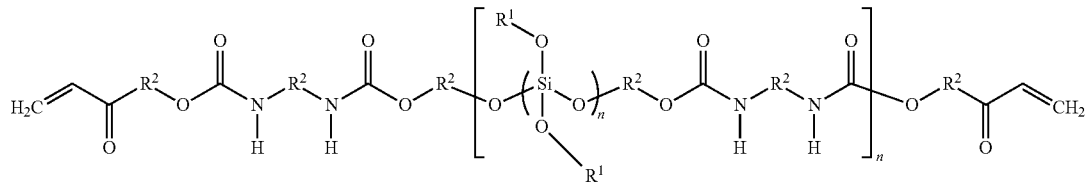

DETAILED DESCRIPTION

I. Oxysilane Formulation.

In one exemplary embodiment, the oxysilane formulation includes an oxysilane-containing polymer or oligomer having at least one oxysilane group and at least one other organic crosslinkable group, an endcapping agent, and a solvent. In some exemplary embodiments, the formulation further includes one or more additives, such as a crosslinker, a surfactant, and/or an antioxidant.

a. Oxysilane-Containing Compound.

The formulation includes one or more polymers or oligomers having an oxysilane group and at least one other organic crosslinkable group. Polymers containing crosslinkable groups can be chemically bonded to each other either by self-crosslinking between the reaction of the crosslinkable groups, or reaction between these groups and a crosslinker, crosslinkable groups in general can be any reactive groups, some contemplated examples include alkenes, alkynes, acrylates, carboxylic acids, alcohols, isocyanates, aldehydes, amines, urethane acrylates, polyester acrylates, and epoxies. Exemplary polymers and oligomers include oxysilane containing acrylic urethanes, such as the MIRAMER SIU 2400 and MIRAMER SIU100 silicone urethane acrylates available from Miwon Specialty Chemical Co., Ltd., polymers and oligomers include oxysilane containing polyester acrylates, such as MIRAMER SIP900 silicone polyester acrylate oligomer available from Miwon Specialty Chemical Co., Ltd.

where $R^1$ is selected from hydrogen, substituted or unsubstituted alkyl groups (methyl, ethyl, n-propyl, i-propyl, n-butyl, t-butyl, pentyl, hexyl), substituted or unsubstituted aryl groups (phenyl, naphthyl), substituted or unsubstituted alkenyl groups (vinyl, propenyl), substituted or unsubstituted cycloalkyl groups, substituted or unsubstituted acrylic groups, and combinations thereof;

$R^2$ are each independently selected from substituted or unsubstituted alkylene groups, substituted and unsubstituted arylene groups, and combinations thereof; and n is an integer from 1 to 10.

In some exemplary embodiments, the oxysilane-containing compound may have a weight average molecular weight (Mw) as little as 500 Dalton, 1000 Dalton, 2000 Dalton, as great as 5000 Dalton, 8000 Dalton, 10,000 Dalton, or within any range defined between any two of the foregoing values, such as 500 Dalton to 10,000 Dalton or 5000 Dalton to 8000 Dalton, for example.

In one exemplary embodiment, the oxysilane-containing compound comprises as little as 1 wt. %, 5 wt. %, 10 wt. %, as great as 20 wt. %, 25 wt. %, 30 wt. % silicon, or a weight percent silicon within any range defined between any two of the foregoing values, such as 1 wt. % to 30 wt. %, or 5 wt. % to 30 wt. %, for example.

In one exemplary embodiment, the formulation comprises as little as 0.1 wt. %, 0.5 wt. %, 1 wt. %, 2 wt. %, 2.5 wt. %, as great as 5 wt. %, 10 wt. %, 15 wt. %, 20 wt. % or 30 wt. % of the one or more oxysilane-containing compounds or within any range defined between any two of the foregoing values, such as 0.5 wt. % to 10 wt. %, or 2 wt. % to 5 wt. %, for example.

b. Solvent.

The formulation includes one or more solvents. Exemplary solvents include suitable pure organic molecules or mixtures thereof that are volatilized at a desired temperature and/or easily solvate the components discussed herein. The solvents may also comprise suitable pure polar and non-polar compounds or mixtures thereof. As used herein, the term "pure" means a component that has a constant composition. For example, pure water is composed solely of $H_2O$. As used herein, the term "mixture" means a component that is not pure, including salt water. As used herein, the term "polar" means that characteristic of a molecule or compound that creates an unequal charge, partial charge or spontaneous charge distribution at one point of or along the molecule or compound. As used herein, the term "non-polar" means that characteristic of a molecule or compound that creates an equal charge, partial charge or spontaneous charge distribution at one point of or along the molecule or compound.

Exemplary solvents include solvents that can, alone or in combination, modify the viscosity, intermolecular forces and surface energy of the solution in order to, in some cases, improve the gap-filling and planarization properties of the composition. It should be understood, however, that suitable solvents may also include solvents that influence the profile of the composition in other ways, such as by influencing the crosslinking efficiency, influencing the thermal stability, influencing the viscosity, and/or influencing the adhesion of the resulting layer or film to other layers, substrates or surfaces.

Exemplary solvents also include solvents that are not part of the hydrocarbon solvent family of compounds, such as ketones, including acetone, diethyl ketone, methyl ethyl ketone and the like, alcohols, esters, ethers and amines. Additional exemplary solvents include ethyl lactate, propylene glycol propylether (PGPE), propylene glycol monomethyl ether acetate (PGMEA), N-methylpyrrolidone, cyclohexanone or a combination thereof. In one exemplary embodiment, the solvent includes propylene glycol monomethyl ether acetate.

In one exemplary embodiment, formulation comprises as little as 50 wt. %, 60 wt. %, 70 wt. %, 80 wt. %, as great as 85 wt. %, 90 wt. %, 95 wt. %, 97 wt. % of the one or more solvents, or within any range defined between any two of the foregoing values, such as 50 wt. % to 97 wt. %, 80 wt. % to 95 wt. %, or 85 wt. % to 95 wt. %, for example.

c. Endcapping Agent.

The formulation includes one or more endcapping agents. In some embodiments, the endcapping agent is a monofunctional silane that includes a single reactive functionality that is capable of reacting with silanol groups on polysiloxane molecules. Exemplary endcapping agents include trialkylsilanes such as trimethylethoxy silane, triethylmethoxy silane, trimethylacetoxy silane, trimethylsilanol, triphenylsilanol, triphenylmethoxysilane, triphenylethoxysilane. In one exemplary embodiment, the endcapping agent includes acetoxytrimethyl silane.

In one exemplary embodiment, the formulation comprises a molar ratio of moles of endcapping agent to moles of crosslinkable groups of the oxysilane-containing compound as little as 1:100, 1:50, 1:20, as great as 1:10, 1:5, or 1:1, or within any range defined between any two of the foregoing ratios, such as 1:100 to 1:1, for example.

Without wishing to be held to any particular theory, it is believed that the inclusion of the endcapping agent controls crosslinking between Si—O groups of the oxysilane-containing polymer or oligomer, while allowing crosslinking of the other organic crosslinkable groups. The formed coating has reduced Si—O—Si bonds, which are relatively resistant to strippability in alkaline SC1 solution. The coating also provides sufficient crosslinking by the organic functional groups to allow for good resistance to strippability in propylene glycol monomethyl ether acetate PGMEA and tetramethylammonium hydroxide (TMAH) solutions, which may be used in the integration process before the middle layer removal.

In one exemplary embodiment, the formulation comprises as little as 0.1 wt. %, 0.5 wt. %, 1 wt. %, 2 wt. %, 2.5 wt. %, as great as 5 wt. %, 10 wt. %, 15 wt. %, or 20 wt. % of the one or more endcapping agents or within any range defined between any two of the foregoing values, such as 0.5 wt. % to 10 wt. % or 2 wt. % to 5 wt. %.

d. Surfactant.

In some exemplary embodiments, the formulation includes one or more surfactants. Surfactants may be added to lower surface tension. As used herein, the term "surfactant" means any compound that reduces the surface tension when dissolved in $H_2O$ or other liquids, or which reduces interfacial tension between two liquids, or between a liquid and a solid. Contemplated surfactants may include at least one anionic surfactant, cationic surfactant, nonionic surfactant, Zwitterionic surfactant or a combination thereof. The surfactant may be dissolved directly into the composition or may be added with one of the compositions components (the at least one silicon-based compound, the at least one catalyst, the at least one solvent) before forming the final composition. Contemplated surfactants may include: polyether modified polydimethylsiloxanes such as BYK 307 and BYK333 (polyether modified poly-dimethyl-siloxane, BYK-Chemie), sulfonates such as dodecylbenzene sulfonate, tetrapropylenebenzene sulfonate, dodecylbenzene sulfonate, a fluorinated anionic surfactant such as Fluorad FC-93, and L-18691 (3M), fluorinated nonionic surfactants such as FC-4430 (3M), FC-4432 (3M), and L-18242 (3M), quaternary amines, such as dodecyltrimethyl-ammonium bromide or cetyltrimethylammonium bromide, alkyl phenoxy polyethylene oxide alcohols, alkyl phenoxy polyglycidols, acetylinic alcohols, polyglycol ethers such as Tergitol TMN-6 (Dow) and Tergitol minifoam 2× (Dow), polyoxyethylene fatty ethers such as Brij-30 (Aldrich), Brij-35 (Aldrich), Brij-58 (Aldrich), Brij-72 (Aldrich), Brij-76 (Aldrich), Brij-78 (Aldrich), Brij-98 (Aldrich), and Brij-700 (Aldrich), betaines, sulfobetaines, such as cocoamidopropyl betaine, and synthetic phospholipids, such as dioctanoyl-phosphatidylcholine and lecithin and combinations thereof. In one embodiment, the surfactant includes a polyether modified polydimethylsiloxane.

In one exemplary embodiment, the formulation comprises as little as 0.001 wt. %, 0.005 wt. %, 0.01 wt. %, 0.05 wt. %, as great as 0.1 wt. %, 0.25 wt. %, 0.5 wt. %, 1 wt. %, 5 wt. % of the one or more surfactants, or within any range defined between any two of the foregoing values, such as 0.001 wt. % to 1 wt. % or 0.001 wt. % to 0.25 wt. %, for example.

In some exemplary embodiments, the surfactant may be provided in water or in an organic solvent such as ethanol or propylene glycol propyl ether (PGPE), for example. In one exemplary embodiment, the surfactant plus water or organic mixture comprises as little as 1 wt. %, 2 wt. %, 3 wt. %, as great as 5 wt. %, 10 wt. %, 15 wt. % of the one or more surfactants, or within any range defined between any two of the foregoing values, such as 1 wt. % to 15 wt. % or 5 wt. % to 10 wt. %, for example.

e. Other Additives—Crosslinkers, Initiators, and Antioxidants.

In some exemplary embodiments, the formulation contains one or more crosslinkers or crosslinking reagents. Crosslinkers are molecules that contain two or more reactive groups capable of attaching to the polymer chains via chemical reaction with corresponding functional groups on the polymer. Exemplary reactive groups include unsaturated groups containing double bonds and triple bonds, such as alkenes, alkynes, acrylates, carboxylic acids, alcohols, isocyanates, aldehydes, amines, urethane acrylates, polyester acrylates, and epoxies. In one embodiment, the formulation includes TRIMETHYLOLPROPANE(EO)3 TRIACRYLATE available from Miwon Specialty Chemical Co., Ltd. In one exemplary embodiment, the formulation includes the crosslinker Miramer PU3600E, a mixture of urethane acrylate oligomer and TRIMETHYLOLPROPANE(EO)3 TRIACRYLATE available from Miwon Specialty Chemical Co., Ltd.

In one exemplary embodiment, the formulation comprises as little as 0.001 wt. %, 0.005 wt. %, 0.01 wt. %, 0.05 wt. %, as great as 0.1 wt. %, 0.25 wt. %, 0.5 wt. %, 1 wt. %, 5 wt. % of the one or more crosslinkers, based on the total weight of the formulation, or within any range defined between any two of the foregoing values, such as 0.001 wt. % to 1 wt. % or 0.001 wt. % to 0.25 wt. %, for example.

In some exemplary embodiments, the formulation contains one or more initiators. Initiators are used to create active centers (radicals) from which a polymer chain is generated, such as generation by thermal decomposition, photolysis or redox reactions. Exemplary initiators include organic and inorganic compounds such as peroxides, azo compounds, metal iodides, and metal alkyls. In one exemplary embodiment, the formulation includes the initiator di-t-butylperoxide.

In one exemplary embodiment, the formulation comprises as little as 0.001 wt. %, 0.005 wt. %, 0.01 wt. %, 0.05 wt. %, as great as 0.1 wt. %, 0.25 wt. %, 0.5 wt. %, 1 wt. % of the one or more initiators, based on the total weight of the formulation, or within any range defined between any two of the foregoing values, such as 0.001 wt. % to 1 wt. % or 0.001 wt. % to 0.25 wt. %, for example.

In some exemplary embodiments, the formulation contains one or more antioxidants. In some exemplary three-level patterning processes, the middle layer is subjected to an oxygen plasma treatment before the SC1 stripping process. During the oxygen plasma treatment, oxygen radicals in the plasma may cause oxidation of organic components of the coating, leaving behind an inorganic SiO layer that is relatively resistant to being stripped by SC1 solution. In some exemplary embodiments, the inclusion of one or more antioxidants reduces the oxidation by oxygen plasma and maintains strippability for the coating. Exemplary antioxidants include benzotriazole and 2-[3-(2H-Benzotriazol-2-yl)-4-hydroxyphenyl]ethyl acrylate, each available from Sigma Aldrich.

In one exemplary embodiment, the formulation comprises as little as 0.001 wt. %, 0.005 wt. %, 0.01 wt. %, 0.05 wt. %, as great as 0.1 wt. %, 0.25 wt. %, 0.5 wt. %, 1 wt. %, 5 wt. %, 10 wt. % of the one or more antioxidants, based on the total weight of the formulation, or within any range defined between any two of the foregoing values, such as 0.001 wt. % to 1 wt. % or 0.001 wt. % to 0.25 wt. %, for example.

II. Coating.

In some exemplary embodiments, the formulation forms a coating on a surface, such as the middle layer 16 as shown in FIG. 1. As shown in FIG. 1, the middle layer 16 may be positioned on a substrate 12 between a photoresist layer 14 and an organic planarization layer 18.

In some exemplary embodiments, the middle layer 16 has a thickness as little as 0.01 µm, 0.05 µm, 0.1 µm, 0.2 µm, 0.25 µm, 0.3 µm, 0.5 µm, 0.75 µm, 1 µm, 1.5 µm, as great as 2 µm, 2.5 µm, 3 µm, 3.5 µm, 4 µm, or greater, or within any range defined between any two of the foregoing values, us as 0.01 µm to 4 µm or 0.1 µm to 2 µm, for example.

In some exemplary embodiments, the polysiloxane coating is formed by applying the formulation to a substrate, followed by curing the formulation. Curing refers to a polymerization process in which the silicon-based materials, such as oxysilane-containing compounds, react to hydrolyze and condense with other oligomers to form a higher molecular weight polymer or matrix. In one exemplary embodiment, a baking step is provided to remove at least part or all of the solvent. In some embodiments, the baking step is as short as 0.5 minutes, 1 minute, 5 minutes, 10 minutes, 15 minutes, as long as 20 minutes, 30 minutes, 45 minutes, 60 minutes, or longer, at a temperature as low as 100° C., 200° C., 220° C., as high as 250° C., 275° C., 300° C., 320° C., 350° C., or higher.

In some exemplary embodiments, the coatings formed from the formulation are stripped by SC1 solutions. In some exemplary embodiments, the coatings are stripped by an SC1 solution comprising (by volume) 5 parts deionized water, 1 part 29% ammonium hydroxide, and 1 part 30% hydrogen peroxide. In some exemplary embodiments, the coatings are stripped by a dilute SC1 solution comprising (by volume) as little as 10 parts, 20 parts, 30 parts, 40 parts, as great as 50 parts, 60 parts, 80 parts, 100 parts deionized water, 1 part 29% ammonium hydroxide, and 1 part 30% hydrogen peroxide. In other exemplary embodiments, the ratio between hydrogen peroxide and ammonium hydroxide in the dilute SC1 solution can also vary. In still other exemplary embodiments, the coatings are stripped by a dilute SC1 solution comprising (by volume) 60 parts deionized water, 1 part 29% ammonium hydroxide, and as little as 2 parts, 5 parts, 10 parts, to as great as 18 parts, 20 parts, 30 parts, 50 parts 30% hydrogen peroxide.

In some exemplary embodiments, the coatings formed from the formulations are preferred to be stripped by one or more of the above SC1 solutions at a temperature below a typical process temperature of 70~80° C. In some exemplary embodiments, the coatings are stripped by an SC1 solution at a temperature as low as 25° C., 30° C., 40° C., as high as 50° C., 60° C., 70° C., or higher.

In some exemplary embodiments, the coating formed from the formulation has good strippability when exposed to an alkaline solution. In some exemplary embodiments, the coating an etch rate in SC1 solution as little as 50 Å/min, 100 Å/min, 150 Å/min, as great as 170 Å/min, 200 Å/min, 250 Å/min, or greater, or within any range defined between any two of the foregoing values, such as 150 Å/min or greater, 50 Å/min to 250 Å/min, or 150 Å/min to 170 Å/min.

In some exemplary embodiments, the coating formed from the formulation is resistant to stripping by PGMEA.

In some exemplary embodiments, the coating has an etch rate in PGMEA solution at room temperature as little as 1 Å/min, 5 Å/min, 10 Å/min, 20 Å/min, as great as 30 Å/min, 40 Å/min, 50 Å/min, or within any range defined between any two of the foregoing values, such as 1 Å/min to 50 Å/min, 5 Å/min to 30 Å/min. In some exemplary embodiments, the coating has an etch rate in PGMEA solution at room temperature of 10 Å/min or less.

In some exemplary embodiments, the coating formed from the formulation is resistant to stripping by TMAH. In some exemplary embodiments, the coating has an etch rate in 2.38% TMAH solution at room temperature as little as 1 Å/min, 5 Å/min, 10 Å/min, 20 Å/min, as great as 30 Å/min, 40 Å/min, 50 Å/min, or within any range defined between any two of the foregoing values, such as 1 Å/min to 50 Å/min, 5 Å/min to 30 Å/min. In some exemplary embodiments, the coating h has an etch rate in 2.38% TMAH solution at room temperature of 10 Å/min or less.

EXAMPLES

The following are examples of SC1 strippable coating formulations with different compositions. The examples are provided for illustration purpose only and are not meant to limit the various embodiments of the present invention in any way. The results are summarized in Table 1, below.

Example 1

A coating formulation was formed by dissolving 10.0 g of oxysilane-containing acrylic urethane (MIRAMER SIU 2400 silicone urethane acrylate available from Miwon Specialty Chemical Co., Ltd.) in 190 g of PGMEA at room temperature, followed by 2.0 g of 10% BYK-307 in ethanol was added dropwise, and the mixture stirred at room temperature for 3 hours and filtered with 0.1 micron PTFE filters.

The formulation was spun onto a silicon wafer coupon at 1500 rpm for 30 seconds and baked at 200° C. for 60 seconds to form a coating of 1130 Å.

Coated wafers were immersed into an SC1 solution of 29% $NH_4OH$/30% $H_2O_2$/$H_2O$ in a 1/18/60 ratio by volume for 3 minutes at 60° C. Etch rates were determined based on the change in thickness before and after wet etching. The results indicated that the coating was not strippable by the SC1 solution. As used herein, the term "Not strippable" means the etch rate is lower than 10 Å/min.

Coated wafers were immersed into an SC1 solution of 29% $NH_4OH$/30% $H_2O_2$/$H_2O$ in a 1/8/60 ratio by volume for 3 minutes at 40° C. The results indicated that the coating was not strippable by the SC1 solution.

Coated wafers were immersed into PGMEA for 1 minute at room temperature, the results indicated that the etch rate is 32 Å/min.

Coated wafers were immersed into 2.38% TMAH for 1 minute at room temperature, the results indicated that the etch rate is 27 Å/min.

Coated wafers were subjected to an oxygen plasma treatment at a power 400 W with O2 flow rate of 400 Sccm under the pressure of 45 mTorr in a TEL etcher for 5 seconds. The plasma dry etch rates were determined based on the change in thickness before and after dry etching. The results indicated that the coating has a dry etch rate of 46 Å/s.

Plasma treated wafers were immersed into an SC1 solution of 29% $NH_4OH$/30% $H_2O_2$/$H_2O$ in a 1/18/60 ratio by volume for 3 minutes at 60° C. The results indicated that the etch rate is 10 Å/min.

Plasma treated wafers were immersed into an SC1 solution of 29% $NH_4OH$/30% $H_2O_2$/$H_2O$ in a 1/8/60 ratio by volume for 3 minutes at 40° C. The results indicated that the coating was not strippable by the SC1 solution.

Example 2

A coating formulation was formed by dissolving 5.0 g of oxysilane-containing acrylic urethane (MIRAMER SIU 2400 silicone urethane acrylate available from Miwon Specialty Chemical Co., Ltd.) and 5.0 g of PU3600E (a mixture of urethane acrylate oligomer and TRIMETHYLOLPROPANE(EO)3 TRIACRYLATE available from Miwon Specialty Chemical Co., Ltd.) in 190 g of PGMEA at room temperature, followed by 2.0 g of 10% BYK-307 in ethanol was added dropwise, then 0.085 g di-t-butylbenzyloxide was added, and the mixture stirred at room temperature for 3 hours and filtered with 0.1 micron PTFE filters.

The formulation was spun onto a silicon wafer coupon at 1500 rpm for 30 seconds and baked at 200° C. for 60 seconds to form a coating of 995 Å.

Coated wafers were immersed into an SC1 solution of 29% $NH_4OH$/30% $H_2O_2$/$H_2O$ in a 1/18/60 ratio by volume for 3 minutes at 60° C. The results indicated that the etch rate is 10 Å/min.

Coated wafers were immersed into an SC1 solution of 29% $NH_4OH$/30% $H_2O_2$/$H_2O$ in a 1/8/60 ratio by volume for 3 minutes at 40° C. The results indicated that the coating was not strippable by the SC1 solution.

Coated wafers were immersed into PGMEA for 1 minute at room temperature, the results indicated that the etch rate is 30 Å/min.

Coated wafers were immersed into 2.38% TMAH for 1 minute at room temperature, the results indicated that the etch rate is 28 Å/min.

Coated wafers were subjected to an oxygen plasma treatment at a power 400 W with O2 flow rate of 400 Sccm under the pressure of 45 mTorr in a TEL etcher for 5 seconds. The results indicated that the coating has a dry etch rate of 108 Å/s.

Plasma treated wafers were immersed into an SC1 solution of 29% $NH_4OH$/30% $H_2O_2$/$H_2O$ in a 1/18/60 ratio by volume for 3 minutes at 60° C. The results indicated that the etch rate is 14 Å/min.

Plasma treated wafers were immersed into an SC1 solution of 29% $NH_4OH$/30% $H_2O_2$/$H_2O$ in a 1/8/60 ratio by volume for 3 minutes at 40° C. The results indicated that the etch rate is 14 Å/min.

Example 3

A coating formulation was formed by dissolving 2.5 g of oxysilane-containing acrylic urethane (MIRAMER SIU 2400 silicone urethane acrylate available from Miwon Specialty Chemical Co., Ltd.) and 7.5 g of PU3600E (a mixture of urethane acrylate oligomer and TRIMETHYLOLPROPANE(EO)3 TRIACRYLATE available from Miwon Specialty Chemical Co., Ltd.) in 190 g of PGMEA at room temperature, followed by 2.0 g of 10% BYK-307 in ethanol was added dropwise, then 0.1 g di-t-butylbenzyloxide was added, and the mixture stirred at room temperature for 3 hours and filtered with 0.1 micron PTFE filters.

The formulation was spun onto a silicon wafer coupon at 1500 rpm for 30 seconds and baked at 200° C. for 60 seconds to form a coating of 960 Å.

Coated wafers were immersed into an SC1 solution of 29% $NH_4OH$/30% $H_2O_2$/$H_2O$ in a 1/18/60 ratio by volume for 3 minutes at 60° C. The results indicated that the coating was not strippable by the SC1 solution.

Coated wafers were immersed into an SC1 solution of 29% $NH_4OH$/30% $H_2O_2$/$H_2O$ in a 1/8/60 ratio by volume for 3 minutes at 40° C. The results indicated that the coating was not strippable by the SC1 solution.

Coated wafers were immersed into PGMEA for 1 minute at room temperature, the results indicated that the etch rate is 38 Å/min.

Coated wafers were immersed into 2.38% TMAH for 1 minute at room temperature, the results indicated that the etch rate is 33 Å/min.

Coated wafers were subjected to an oxygen plasma treatment at a power 400 W with O2 flow rate of 400 Sccm under the pressure of 45 mTorr in a TEL etcher for 5 seconds. The results indicated that the coating has a dry etch rate of 128 Å/s.

Plasma treated wafers were immersed into an SC1 solution of 29% $NH_4OH$/30% $H_2O_2$/$H_2O$ in a 1/18/60 ratio by volume for 3 minutes at 60° C. The results indicated that the etch rate is 24 Å/min.

Plasma treated wafers were immersed into an SC1 solution of 29% $NH_4OH$/30% $H_2O_2$/$H_2O$ in a 1/8/60 ratio by volume for 3 minutes at 40° C. The results indicated that the etch rate is 21 Å/min.

Example 4

A coating formulation was formed by dissolving 5.0 g of oxysilane-containing acrylic urethane (MIRAMER SIU 2400 silicone urethane acrylate available from Miwon Specialty Chemical Co., Ltd.) in 190 g of PGMEA at room temperature, followed by 2.0 g of 10% BYK-307 in ethanol was added dropwise, then 1.0 g acetoxytrimethylsilane was added, and the mixture stirred at room temperature for 3 hours and filtered with 0.1 micron PTFE filters.

The formulation was spun onto a silicon wafer coupon at 1500 rpm for 30 seconds and baked at 200° C. for 60 seconds to form a coating of 500 Å.

Coated wafers were immersed into an SC1 solution of 29% $NH_4OH$/30% $H_2O_2$/$H_2O$ in a 1/18/60 ratio by volume for 3 minutes at 60° C. The results indicated that the etch rate is 158 Å/min.

Coated wafers were immersed into PGMEA for 1 minute at room temperature, the results indicated that the etch rate is 4 Å/min.

Coated wafers were immersed into 2.38% TMAH for 1 minute at room temperature, the results indicated that the etch rate is 1 Å/min.

Coated wafers were subjected to an oxygen plasma treatment at a power 400 W with O2 flow rate of 400 Sccm under the pressure of 45 mTorr in a TEL etcher for 5 seconds. The results indicated that the coating has a dry etch rate of 70 Å/s.

Plasma treated wafers were immersed into an SC1 solution of 29% $NH_4OH$/30% $H_2O_2$/$H_2O$ in a 1/18/60 ratio by volume for 3 minutes at 60° C. The results indicated that the coating was not strippable by SC1.

Example 5

A coating formulation was formed by dissolving 5.0 g of oxysilane-containing acrylic urethane (MIRAMER SIU 2400 silicone urethane acrylate available from Miwon Specialty Chemical Co., Ltd.) in 190 g of PGMEA at room temperature. 5.0 g of acetoxytrimethyl silane was added to the mixture, followed by 2.0 g of 10% BYK-307 in ethanol was added dropwise, and the mixture stirred at room temperature for 3 hours and filtered with 0.1 micron PTFE filters.

The formulation was spun onto a silicon wafer coupon at 1500 rpm for 30 seconds and baked at 200° C. for 60 seconds to form a coating of 543 Å.

The coated wafers were immersed into an SC1 solution of 29% $NH_4OH$/30% $H_2O_2$/$H_2O$ in a 1/18/60 ratio by volume for 3 minutes at 60 C. Etch rates were determined based on the change in thickness before and after wet etching. The results indicated that the coating was totally removed by the SC1 solution with etch rate of 173 Å/min.

Some coated wafers were immersed into an SC1 solution of 29% $NH_4OH$/30% $H_2O_2$/$H_2O$ in a 1/1/40 ratio by volume for 3 minutes at 60° C. The results indicated that the etch rate is 181 Å/min.

Some coated wafers were immersed into PGMEA for 1 minute at room temperature, the results indicated that the etch rate is 5 Å/min.

Some coated wafers were immersed into 2.38% TMAH for 1 minute at room temperature, the results indicated that the etch rate is 9 Å/min.

Some coated wafers were subjected to an oxygen plasma treatment at a power 400 W with O2 flow rate of 400 Sccm under the pressure of 45 mTorr in a TEL etcher for 5 seconds. The results indicated that the coating has a dry etch rate of 73 Å/s.

Some plasma treated wafers were immersed into an SC1 solution of 29% $NH_4OH$/30% $H_2O_2$/$H_2O$ in a 1/18/60 ratio by volume for 3 minutes at 60° C. The results indicated that the coating was not strippable by SC1.

Some plasma treated wafers were immersed into an SC1 solution of 29% $NH_4OH$/30% $H_2O_2$/$H_2O$ in a 1/1/40 ratio by volume for 3 minutes at 60° C. The results indicated that the etch rate is 17 Å/min.

Example 6

A coating formulation was formed by dissolving 6.95 g of oxysilane-containing polyester acrylate oligomer (MIRAMER SIP 900 silicone polyester acrylate available from Miwon Specialty Chemical Co., Ltd.) in 200 g of PGMEA at room temperature, followed by 3.0 g acetoxytrimethylsilane was added, and the mixture stirred at room temperature for 3 hours and filtered with 0.1 micron PTFE filters.

The formulation was spun onto a silicon wafer coupon at 1500 rpm for 30 seconds and baked at 200° C. for 60 seconds to form a coating of 884 Å.

Some coated wafers were immersed into an SC1 solution of 29% $NH_4OH$/30% $H_2O_2$/$H_2O$ in a 1/1/40 ratio by volume for 3 minutes at 60° C. The results indicated that the etch rate is 118 Å/min.

Some coated wafers were immersed into PGMEA for 1 minute at room temperature, the results indicated that the etch rate is 732 Å/min.

Some coated wafers were immersed into 2.38% TMAH for 1 minute at room temperature, the results indicated that the etch rate is 480 Å/min.

Some coated wafers were subjected to an oxygen plasma treatment at a power 400 W with O2 flow rate of 400 Sccm under the pressure of 45 mTorr in a TEL etcher for 3 seconds. The results indicated that the coating has a dry etch rate of 55 Å/s.

Some plasma treated wafers were immersed into an SC1 solution of 29% $NH_4OH$/30% $H_2O_2$/$H_2O$ in a 1/1/40 ratio by volume for 3 minutes at 60° C. The results indicated that the etch rate is 18 Å/min.

Example 7

A coating formulation was formed by dissolving 5.0 g of oxysilane-containing acrylic urethane (MIRAMER SIU 2400 silicone urethane acrylate available from Miwon Specialty Chemical Co., Ltd.) in 190 g of PGMEA at room temperature. 5.0 g of acetoxytrimethyl silane was added to the mixture, followed by 2.0 g of 10% BYK-307 in ethanol was added dropwise, then 1.0 g TRIMETHYLOLPROPA-NE(EO)3 TRIACRYLATE was added, and the mixture stirred at room temperature for 3 hours and filtered with 0.1 micron PTFE filters.

The formulation was spun onto a silicon wafer coupon at 1500 rpm for 30 seconds and baked at 200° C. for 60 seconds to form a coating of 575 Å.

Some coated wafers were immersed into an SC1 solution of 29% $NH_4OH$/30% $H_2O_2$/$H_2O$ in a 1/1/40 ratio by volume for 3 minutes at 60° C. The results indicated that the etch rate is 193 Å/min.

Some coated wafers were immersed into PGMEA for 1 minute at room temperature, the results indicated that the etch rate is 31 Å/min.

Some coated wafers were immersed into 2.38% TMAH for 1 minute at room temperature, the results indicated that the etch rate is 34 Å/min.

Some coated wafers were subjected to an oxygen plasma treatment at a power 400 W with O2 flow rate of 400 Sccm under the pressure of 45 mTorr in a TEL etcher for 1 second. The results indicated that the coating has a dry etch rate of 42 Å/s.

Some plasma treated wafers were immersed into an SC1 solution of 29% $NH_4OH$/30% $H_2O_2$/$H_2O$ in a 1/1/40 ratio by volume for 3 minutes at 60° C. The results indicated that the etch rate is 176 Å/min.

Example 8

A coating formulation was formed by dissolving 5.0 g of oxysilane-containing acrylic urethane (MIRAMER SIU 2400 silicone urethane acrylate available from Miwon Specialty Chemical Co., Ltd.) in 190 g of PGMEA at room temperature. 5.0 g of acetoxytrimethyl silane was added to the mixture, followed by 2.0 g of 10% BYK-307 in ethanol was added dropwise, then 1.0 g benzotriazole was added, and the mixture stirred at room temperature for 3 hours and filtered with 0.1 micron PTFE filters.

The formulation was spun onto a silicon wafer coupon at 1500 rpm for 30 seconds and baked at 200° C. for 60 seconds to form a coating of 430 Å.

Some coated wafers were immersed into an SC1 solution of 29% $NH_4OH$/30% $H_2O_2$/$H_2O$ in a 1/1/40 ratio by volume for 3 minutes at 60° C. The results indicated that the etch rate is 217 Å/min.

Some coated wafers were immersed into PGMEA for 1 minute at room temperature, the results indicated that the etch rate is 0.3 Å/min.

Some coated wafers were immersed into 2.38% TMAH for 1 minute at room temperature, the results indicated that the etch rate is 2 Å/min.

Some coated wafers were subjected to an oxygen plasma treatment at a power 400 W with O2 flow rate of 400 Sccm under the pressure of 45 mTorr in a TEL etcher for 1 second. The results indicated that the coating has a dry etch rate of 29 Å/s.

Some plasma treated wafers were immersed into an SC1 solution of 29% $NH_4OH$/30% $H_2O_2$/$H_2O$ in a 1/1/40 ratio by volume for 3 minutes at 60° C. The results indicated that the etch rate is 203 Å/min.

Example 9

A coating formulation was formed by dissolving 2.75 g of MIRAMER SIU 2400 (silicone urethane acrylate available from Miwon Specialty Chemical Co., Ltd.) and 2.75 g of MIRAMER SIU 100 (silicone urethane acrylate available from Miwon Specialty Chemical Co., Ltd.) in 190 g of PGMEA at room temperature. 5.5 g of acetoxytrimethyl silane was added to the mixture, followed by 2.0 g of 10% BYK-307 in ethanol was added dropwise, and the mixture stirred at room temperature for 3 hours and filtered with 0.1 micron PTFE filters.

The formulation was spun onto a silicon wafer coupon at 1500 rpm for 30 seconds and baked at 200° C. for 60 seconds to form a coating of 609 Å.

Some coated wafers were immersed into an SC1 solution of 29% $NH_4OH$/30% $H_2O_2$/$H_2O$ in a 1/1/40 ratio by volume for 3 minutes at 60° C. The results indicated that the etch rate is 198 Å/min.

Some coated wafers were immersed into PGMEA for 1 minute at room temperature, the results indicated that the etch rate is 43 Å/min.

Some coated wafers were immersed into 2.38% TMAH for 1 minute at room temperature, the results indicated that the etch rate is 48 Å/min.

Some coated wafers were subjected to an oxygen plasma treatment at a power 400 W with O2 flow rate of 400 Sccm under the pressure of 45 mTorr in a TEL etcher for 1 second. The results indicated that the coating has a dry etch rate of 37 Å/s.

Some plasma treated wafers were immersed into an SC1 solution of 29% $NH_4OH$/30% $H_2O_2$/$H_2O$ in a 1/1/40 ratio by volume for 3 minutes at 60° C. The results indicated that the etch rate is 181 Å/min.

Example 10

A coating formulation was formed by dissolving 2.5 g of MIRAMER SIU 2400 (silicone urethane acrylate available from Miwon Specialty Chemical Co., Ltd.) and 2.5 g of MIRAMER SIU 100 (silicone urethane acrylate available from Miwon Specialty Chemical Co., Ltd.) in 200 g of PGMEA at room temperature. 1.0 g of acetoxytrimethyl silane was added to the mixture, followed by 0.05 g of di-t-butyl peroxide and 1.25 g of 2-[3-(2H-Benzotriazol-2-yl)-4-hydroxyphenyl]ethyl acrylate g of 10% BYK-307 in ethanol was added dropwise, and the mixture stirred at room temperature for 3 hours and filtered with 0.1 micron PTFE filters.

The formulation was spun onto a silicon wafer coupon at 1500 rpm for 30 seconds and baked at 200° C. for 60 seconds to form a coating of 550 Å.

Coated wafers were immersed into an SC1 solution of 29% $NH_4OH$/30% $H_2O_2$/$H_2O$ in a 1/1/40 ratio by volume for 3 minutes at 60° C. The results indicated that the etch rate is 182 Å/min.

Coated wafers were immersed into PGMEA for 1 minute at room temperature, the results indicated that the etch rate is 32 Å/min.

Coated wafers were immersed into 2.38% TMAH for 1 minute at room temperature, the results indicated that the etch rate is 27 Å/min.

Coated wafers were subjected to an oxygen plasma treatment at a power 400 W with O2 flow rate of 400 Sccm under the pressure of 45 mTorr in a TEL etcher for 1 second. The results indicated that the coating has a dry etch rate of 29 Å/s.

Plasma treated wafers were immersed into an SC1 solution of 29% $NH_4OH$/30% $H_2O_2$/$H_2O$ in a 1/1/40 ratio by volume for 3 minutes at 60° C. The results indicated that the etch rate is 171 Å/min.

Table 1 provides a summary of Examples 1-10. Oxygen plasma etching was performed at 45 mT, 400 W, with an oxygen flow rate of 400 Sccm for the time provided. The 1/8/60 SC1 solution was formed from 29% $NH_4OH$/30% $H_2O_2$/$H_2O$ at a ratio of 1/8/60 by volume, and the etch rate was determined at 40° C. for 3 minutes. The 1/18/60 SC1 solution was formed from 29% $NH_4OH$/30% $H_2O_2$/$H_2O$ at a ratio of 1/18/60 by volume, and the etch rate was determined at 60° C. for 3 minutes. The 1/1/400 SC1 solution was formed from 29% $NH_4OH$/30% $H_2O_2$/$H_2O$ at a ratio of 1/1/40 by volume, and the etch rate was determined at 60° C. for 3 minutes. Etch rates in PGMEA and 2.38% TMAH were determined at room temperature. The designation "N/S" in Table 1 indicates that the coating was not strippable, having an etch rate is lower than 10 Å/min.

TABLE 1

Summary of Examples

| Ex. | Thickness (Å) | $O_2$ plasma etch time (s) | $O_2$ plasma etch rate (Å/s) | Etch rate in 1/8/60 SC1 solution at 40° C. (Å/min) | Etch rate in 1/18/60 SC1 solution at 60° C. (Å/min) | Etch rate in 1/1/40 SC1 solution at 60° C. (Å/min) | Etch rate in PGMEA at RT (Å/min) | Etch rate in 2.38% TMAH @ RT (Å/min) |
|---|---|---|---|---|---|---|---|---|
| 1 | 1130 | None | — | N/S | N/S | — | 32 | 27 |
|  |  | 5 | 46 | N/S | 10 | — | — | — |
| 2 | 995 | None | — | N/S | 10 | — | 30 | 28 |
|  |  | 5 | 108 | 14 | 14 | — | — | — |
| 3 | 960 | None | — | N/S | N/S | — | 38 | 33 |
|  |  | 5 | 128 | 21 | 24 | — | — | — |
| 4 | 500 | None | — | — | 158 | — | 4 | 1 |
|  |  | 5 | 70 | — | N/S | — | — | — |
| 5 | 543 | None | — | — | 173 | 181 | 5 | 9 |
|  |  | 5 | 73 | — | N/S | 17 | — | — |
| 6 | 884 | None | — | — | — | 118 | 732 | 480 |
|  |  | 3 | 55 | — | — | 18 | — | — |
| 7 | 575 | None | — | — | — | 193 | 31 | 34 |
|  |  | 1 | 42 | — | — | 176 | — | — |
| 8 | 430 | None | — | — | — | 217 | 0.3 | 2 |
|  |  | 1 | 29 | — | — | 203 | — | — |
| 9 | 609 | None | — | — | — | 198 | 43 | 48 |
|  |  | 1 | 37 | — | — | 181 | — | — |
| 10 | 550 | None | — | — | — | 182 | 32 | 27 |
|  |  | 1 | 29 | — | — | 171 | — | — |

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

The invention claimed is:

1. A composition for forming a coating, the composition comprising:

at least one oxysilane-containing polymer or oligomer having an oxysilane group and at least one other organic crosslinkable group;

an endcapping agent; and a solvent.

2. The composition of claim 1, where in the oxysilane-containing polymer or oligomer has the formula:

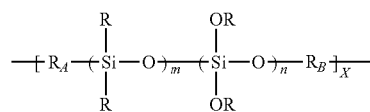

where:

each R is independently selected from hydrogen, substituted or unsubstituted alkyl groups, substituted or unsubstituted aryl groups, substituted or unsubstituted alkenyl groups, substituted or unsubstituted cycloalkyl groups, substituted or unsubstituted acrylic groups, and combinations thereof;

$R_A$ and $R_B$ are each a polymer moieties containing one or more crosslinkable groups independently selected from the group consisting of: alkenes, alkynes, acrylates, carboxylic acids, alcohols, isocyanates, aldehydes, amines, urethane acrylates, polyester acrylates, and epoxies;

m is an integer from 0 to 10;

n is an integer from 1 to 10; and

X is an integer from 1 to 10.

3. The composition of claim 1, wherein the oxysilane-containing polymer or oligomer is an oxysilane containing acrylic urethane.

4. The composition of claim 1, wherein the oxysilane-containing polymer or oligomer has the formula:

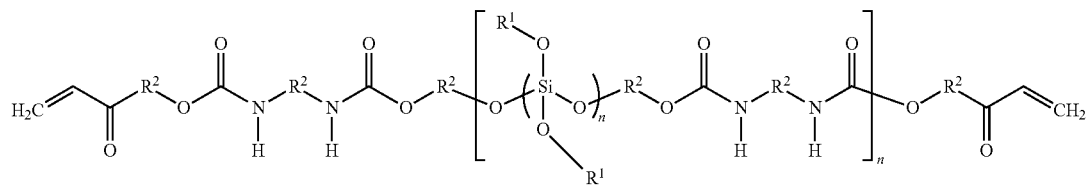

where
R$^1$ is selected from hydrogen, substituted or unsubstituted alkyl groups, substituted or unsubstituted aryl groups, substituted or unsubstituted alkenyl groups, substituted or unsubstituted cycloalkyl groups, substituted or unsubstituted acrylic groups, and combinations thereof;
R$^2$ are each independently selected from substituted or unsubstituted alkylene groups, substituted and unsubstituted arylene groups, and combinations thereof; and
n is an integer from 1 to 10.

5. The composition of claim 1, wherein the oxysilane-containing polymer or oligomer has a weight average molecular weight of 500 Dalton to 10,000 Dalton.

6. The composition of claim 1, wherein the oxysilane-containing polymer or oligomer comprises from 1 wt. % to 30 wt. % silicon.

7. The composition of claim 1, wherein the oxysilane-containing polymer or oligomer comprises from 0.5 wt. % to 30 wt. % of the total weight of the composition.

8. The composition of claim 1, wherein the endcapping agent is selected from the group consisting of: trimethylethoxy silane, triethylmethoxy silane, trimethylacetoxy silane, trimethylsilanol, triphenylsilanol, triphenylmethoxysilane, triphenylethoxysilane.

9. The composition of claim 1, wherein the endcapping agent includes acetoxy trimethyl silane.

10. The composition of claim 1, wherein a molar ratio of endcapping agent to moles of crosslinkable groups on the oxysilane-containing polymer or oligomer is from 1:100 to 1:1.

11. The composition of claim 1, wherein the endcapping agent comprises form 0.1 wt. % to 20 wt. % of the total weight of the composition.

12. The composition of claim 1, further comprising at least one surfactant, wherein the surfactant comprises from 0.01 wt. % to 15 wt. % of the total weight of the composition.

13. The composition of claim 1, further comprising at least one additive selected from the group consisting of a crosslinker, an initiator, and an antioxidant.

14. A coating formed from the composition of claim 1, where the coating has an etch rate of at least 10 Å/min in SC1 at a temperature of 60° C., wherein the SC1 solution comprises 29% NH$_4$OH/30% H$_2$O$_2$/H$_2$O in a 1/8/60 ratio by volume.

15. The coating of claim 14, wherein the coating has an etch rate in SC1 solution of at least 50 Å/min.

16. The coating of claim 14, wherein the coating has a minimum temperature for SC1 stripping from 25° C. to 65° C.

17. The coating of claim 14, wherein the coating has an etch rate in PGMEA at room temperature and 2.38% TMAH solution at room temperature of 10 Å/min or less.

18. A coated substrate comprising:
the substrate, wherein the substrate is a silicon wafer or coated silicon wafer;
an organic planarization layer in contact with the substrate;
a photoresist layer; and
a middle layer positioned between the organic planarization layer and the photoresist layer, wherein the middle layer is formed from a composition comprising:
at least one oxysilane-containing polymer or oligomer having an oxysilane group and at least one other organic crosslinkable group;
an endcapping agent; and
a solvent.

19. The coated substrate of claim 18, wherein the middle layer has an etch rate in SC1 solution of 150 Å/min or greater and an etch rate in PGMEA at room temperature and 2.38% TMAH solution at room temperature of 10 Å/min or less wherein the SC1 solution comprises 29% NH$_4$OH/30% H$_2$O$_2$/H$_2$O in a 1/8/60 ratio by volume.

20. A method of patterning a substrate comprising the steps of:
sequentially applying an organic planarization layer, a middle layer, and a photoresist layer to a surface of the substrate, the middle layer formed from a composition comprising
at least one oxysilane-containing polymer or oligomer having an oxysilane group and at least one other organic crosslinkable group, an endcapping agent, and a solvent;
patterning the photoresist layer using photolithography and removing a portion of the photoresist layer to transfer the pattern to the photoresist layer;
removing a portion of the middle layer to transfer the pattern to the middle layer;
removing the patterned photoresist layer and removing a portion of the organic planarization layer to transfer the pattern to the organic planarization layer;
removing the patterned middle layer and removing a portion of the substrate to transfer the pattern to the substrate; and
removing the patterned organic planarization layer.

* * * * *